(12) United States Patent
Kuzmenka et al.

(10) Patent No.: US 11,368,142 B1
(45) Date of Patent: Jun. 21, 2022

(54) DUTY-CYCLE CORRECTOR CIRCUITS AND RELATED APPARATUSES AND METHODS

(71) Applicant: Micron Technology, Inc., Boise, ID (US)

(72) Inventors: Maksim Kuzmenka, Munich (DE); Elena Cabrera Bernal, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/366,655

(22) Filed: Jul. 2, 2021

(51) Int. Cl.
*H03K 3/017* (2006.01)
*H03K 19/20* (2006.01)
*G06F 1/04* (2006.01)

(52) U.S. Cl.
CPC .............. *H03K 3/017* (2013.01); *G06F 1/04* (2013.01); *H03K 19/20* (2013.01)

(58) Field of Classification Search
CPC ...... H03K 3/017; H03K 5/1565; H03K 5/135; H03K 5/133; H03K 5/1534; H03K 5/00006; H03K 5/05; H03K 7/08; H03L 7/18; H03L 7/087; H03L 7/0812; H03L 7/0816; H03L 7/0814; H03L 7/0891; H03L 7/07; H03L 7/08; H03L 7/095; H03L 7/0995; G06F 1/04; G06F 1/06; G06F 1/08; G06F 1/10; G11C 11/4076; G11C 11/4023

See application file for complete search history.

(56) References Cited

U.S. PATENT DOCUMENTS

| | | | |
|---|---|---|---|
| 9,838,029 B1* | 12/2017 | Gao | H03K 5/1515 |
| 2019/0386649 A1* | 12/2019 | Chen | H03K 5/151 |
| 2020/0312399 A1* | 10/2020 | Brox | G11C 11/221 |
| 2020/0313627 A1* | 10/2020 | Ni | H03F 3/45475 |

* cited by examiner

*Primary Examiner* — John W Poos

(74) *Attorney, Agent, or Firm* — TraskBritt

(57) ABSTRACT

Apparatuses and methods for correcting a duty-cycle of a clock signal are disclosed. An apparatus includes an integrator circuit, an amplifier circuit, and an electrically controllable switch. The integrator circuit is configured to provide an integrator signal indicating substantially an integral of a corrected clock signal. The amplifier circuit is configured to be disabled responsive to a detection that an input clock signal is disabled. The amplifier circuit includes a first amplifier input terminal and a second amplifier input terminal. The electrically controllable switch is configured to selectively electrically connect the first amplifier input terminal to the second amplifier input terminal responsive to the detection that the input clock signal is disabled. A method of correcting a duty-cycle of an input clock signal includes adjusting a corrected duty-cycle of the corrected clock signal responsive to a first error signal and a second error signal from the amplifier circuit.

20 Claims, 7 Drawing Sheets

DUTY-CYCLE CORRECTOR CIRCUITS AND RELATED APPARATUSES AND METHODS

TECHNICAL FIELD

This disclosure relates generally to duty-cycle corrector circuits, and more specifically to the use of a clock detector to disable duty-cycle correction responsive to disablement of an input clock signal.

BACKGROUND

Many electronic devices use clock signals to control timing of performance of operations. Examples of devices that may be used to generate clock signals include crystal (e.g., quartz) oscillators and oscillator circuits (e.g., voltage-controlled oscillators, or VCOs). Duty-cycles of the clock signals that these devices provide may not be perfect in an as-fabricated electronic device, and may vary during operation of the device. For example, it may be desired to operate an electronic device using a clock signal that has a 50% duty-cycle. Deviations from a desired duty-cycle in a clock signal may be problematic for operation of some electronic devices.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
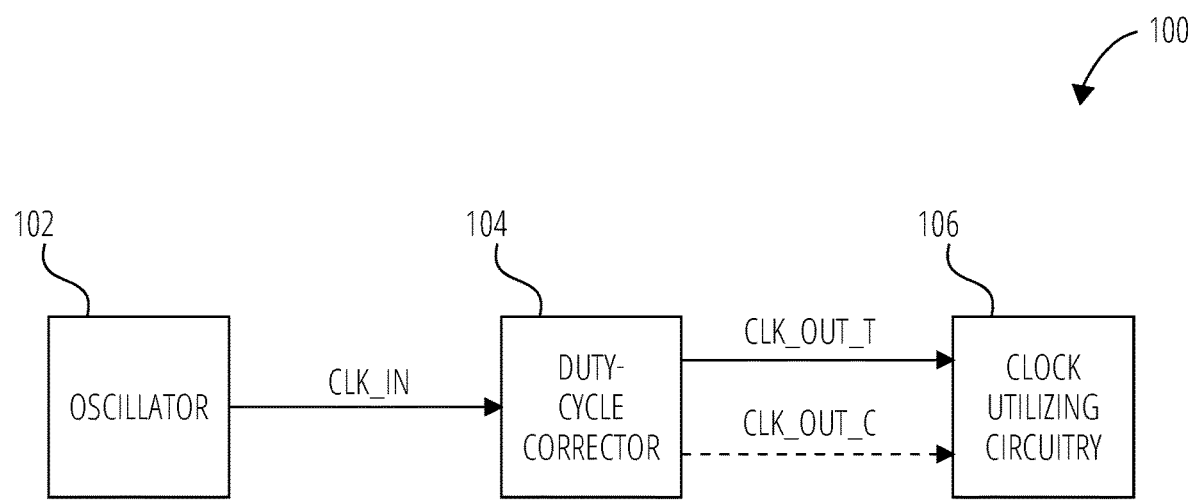
FIG. 1 is a block diagram of an electronic device, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "electrically connected" refers to both direct electrical connection (i.e., no intervening objects electrically connected between) and indirect electrical connection (i.e., one or more intervening objects electrically connected between).

As used herein, the term "assert" and other forms of the term "assert" (e.g., "asserted," "asserting," "assertion"), when used to indicate the state of an electrical signal, refer to transitioning and/or holding the electrical signal to and/or in a state that triggers circuitry that receives the electrical signal to perform a predetermined function. For example, an operational amplifier may have an enable input terminal, and may be activated responsive to an assertion (e.g., a transition from a logic level low voltage potential to a logic level high voltage potential) of an enable signal provided to the enable input terminal. It will be apparent to those of ordinary skill in the art that an assertion of an electrical signal may include a transition from a logic level low voltage potential to a logic level high voltage potential, a transition from a logic level high voltage potential to a logic level low voltage potential, a maintenance of a logic level high voltage potential, a maintenance of a logic level low voltage potential, a transition from a first logic level voltage potential to a second logic level voltage potential (e.g., in a system including three or more logic level voltage potentials), or combinations thereof. Also, as used herein, the term "de-assert" and other forms of the term "de-assert" (e.g., "de-asserted," "de-asserting," "de-assertion") refer to transitioning and/or holding an electrical signal to and/or in a state that disables circuitry that receives the electrical signal from performing a predetermined function.

As used herein, the term "active material" refers to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

Quality of clock signals (e.g., the clock signal duty-cycle and clock signal jitter) in electronic devices (e.g., memory devices) is relevant to high-frequency data transfer. Some systems that use complementary metal oxide semiconductor (CMOS) signaling may benefit from duty-cycle trimming. One way to perform duty-cycle trimming of a clock signal is to use a string of inverters with at least one inverter having variable strength PMOS field effect transistors (PFETs) and NMOS field effect transistors (NFETS). A number of transistors of the inverter used to drive a signal (e.g., a clock signal) may be controlled by electrically connecting and disconnecting transistors using switches. A rising time and a falling time, and correspondingly the duty-cycle, may be adjusted based on switching of the transistors.

Another way to perform duty-cycle trimming of a clock signal may be to use pull-up and pull-down resistors that are selectively electrically connectable to an input of an inverter. By connecting or disconnecting additional pull-up or pull-down resistors toward a positive supply or a negative supply (e.g., ground), respectively, an operational point (e.g., a voltage potential) at the input of the inverter may be adjusted, which may adjust the duty-cycle of an output of the inverter.

These approaches to trimming duty-cycles may be applicable to one time trimming (e.g., at manufacturing of an electronic device, at power-up of an electronic device), but may not be able to compensate duty-cycle error during operation (e.g., due to temperature change). Also, manipulations of switches in duty-cycle trimmers may destroy one of the clock cycles at an output of a duty-cycle trimmer if such switch manipulations are done over a running clock.

In some embodiments a duty-cycle of a signal (e.g., a clock signal) may be tracked "on the fly." In other words, the duty-cycle of the signal may be measured and regulated over the running clock signal during operation of an electronic device that is using the clock signal. By way of non-limiting example, the duty-cycle may be measured using an integrating resistor-capacitor (RC) circuit. Assuming that a 50% duty-cycle is desired, an integrating RC circuit electrically connected to an output of a duty-cycle trimmer may charge to a voltage potential that is halfway between logic level voltage potentials (e.g., halfway between a logic level high voltage potential and a logic level low voltage potential). Circuitry may compare the output of the duty-cycle trimmer to a reference voltage potential (e.g., using a comparator or an operational amplifier, without limitation). By way of non-limiting example, the reference voltage potential may be generated using a simple resistive voltage divider circuit (e.g., to provide a reference voltage potential that is halfway between the logic level voltage potentials). An operational amplifier may derive an error signal, amplify the error signal, and feed the error signal back to an intermediate point between two inverters in order to correct for any duty-cycle distortion. As a result, the duty-cycle of a clock signal provided by the duty-cycle trimmer may be maintained close to 50% over variations of the power supply voltage potentials, the logic level voltage potentials, temperature, and transistor degradation over time.

Many electronic devices, including some electronic devices that are sensitive to duty-cycle of clock signals, may sometimes operate in low-power modes and/or may shut down operation to preserve power. During low-power modes and/or shut down modes an input clock signal may be maintained at one logic level voltage potential rather than continue to oscillate between two logic level voltage potentials. As a result, an error signal provided by an integrating RC circuit may saturate to the logic level voltage potential that the input clock signal is held at. When the input clock signal is later activated, it may take many clock cycles before the error signal deviates from saturation at the logic level voltage potential that the input clock signal was held at during the low-power and/or shut down mode. As a result, the corrected clock signal provided by the duty-cycle trimmer may be distorted for many clock cycles, and some clock periods of the corrected clock signal may even disappear completely. By way of non-limiting example, it may take ten to twenty clock cycles before the error signal deviates sufficiently from a logic level voltage potential to enable the duty-cycle trimmer to operate correctly.

Although data transitions in some electronic devices such as memory devices may not start with a first clocking edge after transition from a low-power or deactivated state, some no-operation (NOP) edges may be required for proper operation. In other words, for some electronic devices such as memory devices, if the clock signal output by the duty-cycle trimmer does not resolve within substantially one clock cycle of activation, problems in operation may result.

Also, at high frequency, rising and falling edges of a clock signal may not be linear, and an integrator that receives the clock signal may not be at exactly halfway between the logic level voltage potentials even if the duty-cycle is at the desired level. One way to deal with this issue may be to store a value indicating a voltage potential of an error signal at the integrator at a time of transition to a low-power mode or a deactivated mode. A voltage potential substantially at the stored value may be provided to the integrator when the clock signal is reactivated. Unfortunately, digitization (e.g., using an analog to digital converter) of the error signal and storage (e.g., using specialized registers) of the digitized value at deactivation may increase the complexity of the electronic device. Also, system parameters (e.g., power rail voltage potentials, temperature) may drift during downtime, which may render the stored value invalid for the parameters at reactivation.

Disclosed herein are duty-cycle correctors that measure and regulate duty-cycles of clock signals during operation of electronic devices that use the clock signals. These duty-cycle correctors may use clock detectors to disable the duty-cycle correction responsive to detecting that input clock signals provided thereto are disabled. Accordingly, error signals indicating errors in duty-cycles of corrected clock signals provided by these duty-cycle correctors may not saturate while the input clock signals are disabled. As a result, the error signals may already be at appropriate levels at reactivation of the input clock signals, and the corrected clock signals may be regulated within a clock cycle or a few clock cycles of reactivation.

In some embodiments an apparatus includes an integrator circuit, an amplifier circuit, and an electrically controllable switch. The integrator circuit is configured to receive a corrected clock signal and a complementary corrected clock signal. The complementary corrected clock signal is complementary to the corrected clock signal. The integrator circuit is configured to provide an integrator signal indicating substantially an integral of the corrected clock signal. The integrator is also configured to provide a complementary integrator signal indicating substantially an integral of the complementary corrected clock signal. The amplifier circuit is configured to control corrections made to a duty-cycle of the corrected clock signal. The amplifier circuit is configured to be disabled responsive to a detection that an input clock signal is disabled. The amplifier circuit includes a first amplifier input terminal configured to receive the integrator signal. The amplifier also includes a second amplifier input terminal configured to receive the complementary integrator signal. The electrically controllable switch is configured to selectively electrically connect the first amplifier input terminal to the second amplifier input terminal responsive to the detection that the input clock signal is disabled.

In some embodiments an apparatus includes a duty-cycle adjuster, an integrator circuit, an amplifier circuit, and a clock detector. The duty-cycle adjuster is configured to receive an input clock signal and correct a duty-cycle of a corrected clock signal relative to an input duty-cycle of the input clock signal. The integrator circuit is configured to generate an integrator signal responsive to the corrected clock signal. The integrator signal substantially indicates an integral of the corrected clock signal over time. The amplifier circuit is configured to control corrections made to the duty-cycle of the corrected clock signal by the duty-cycle adjuster responsive to the integrator signal. The clock detector is configured to disable the corrections made to the duty-cycle of the corrected clock signal responsive to a detection that the input clock signal is disabled.

In some embodiments a method of correcting a duty-cycle of an input clock signal includes generating an intermediate corrected clock signal responsive to an input clock signal, splitting the intermediate corrected clock signal into a corrected clock signal and a complementary corrected clock signal, integrating the corrected clock signal to generate an integrator signal, and integrating the complementary corrected clock signal to generate a complementary integrator signal. The method also includes generating, with an amplifier circuit, a first error signal and a second error signal responsive to the integrator signal provided to a first amplifier input terminal of the amplifier circuit and the complementary integrator signal provided to a second amplifier input terminal of the amplifier circuit. The method further includes adjusting a corrected duty-cycle of the intermediate corrected clock signal relative to a duty-cycle of the input clock signal responsive to the first error signal and the second error signal and electrically connecting the first amplifier input terminal to the second amplifier input terminal responsive to a detection that the input clock signal is not activated.

FIG. 1 is a block diagram of an electronic device 100, according to some embodiments. The electronic device 100 includes an oscillator 102, a duty-cycle corrector 104, and clock utilizing circuitry 106. The oscillator 102 is configured to generate an input clock signal CLK_IN. The duty-cycle corrector 104 is configured to correct a duty-cycle of the input clock signal CLK_IN and provide a corrected clock signal CLK_OUT_T to the clock utilizing circuitry 106.

The clock utilizing circuitry 106 is configured to use the corrected clock signal CLK_OUT_T for operation of the clock utilizing circuitry 106. By way of non-limiting example, the clock utilizing circuitry 106 may include synchronous digital circuitry that is clocked by the corrected clock signal CLK_OUT_T. As a specific, non-limiting example, the clock utilizing circuitry 106 may include memory circuitry.

The duty-cycle corrector 104 is configured to measure and regulate a corrected duty-cycle of the corrected clock signal CLK_OUT_T during operation of the clock utilizing circuitry 106. The duty-cycle corrector 104 is also configured to be disabled responsive to detecting that the input clock signal CLK_IN is disabled.

In some embodiments the duty-cycle corrector 104 is configured to provide a complementary corrected clock signal CLK_OUT_C to the clock utilizing circuitry 106. The complementary corrected clock signal CLK_OUT_C may be complementary to the corrected clock signal CLK_

OUT_T. For example, the complementary corrected clock signal CLK_OUT_C may be at a logic level voltage potential that is complementary to a logic level voltage potential of the corrected clock signal CLK_OUT_T. As a specific, non-limiting example, as the corrected clock signal CLK_OUT_T oscillates from 1 to 0 to 1 to 0, the complementary corrected clock signal may oscillate from 0 to 1 to 0 to 1.

Figure 2:
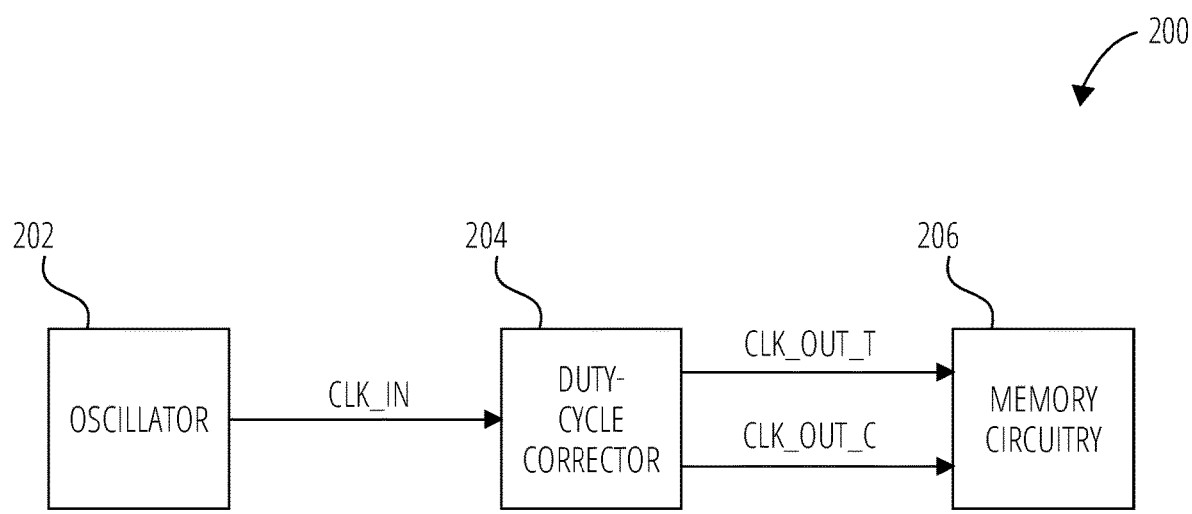
FIG. 2 is a block diagram of a memory device, according to some embodiments.

FIG. 2 is a block diagram of a memory device 200, according to some embodiments. The memory device 200 includes an oscillator 202 and a duty-cycle corrector 204 similar to the oscillator 102 and the duty-cycle corrector 104 discussed with reference to FIG. 1. Similar to the oscillator 102, the oscillator 202 provides an input clock signal CLK_IN to the duty-cycle corrector 204, and the duty-cycle corrector 204 provides corrected clock signals (i.e., the corrected clock signal CLK_OUT_T and the complementary corrected clock signal CLK_OUT_C) responsive to the input clock signal CLK_IN.

The memory device 200 also includes memory circuitry 206, which uses the corrected clock signals in its operation. By way of non-limiting example, high-speed data transfer (e.g., read operations, write operations) may be clocked using the corrected clock signals provided by the duty-cycle corrector 204.

Figure 3:
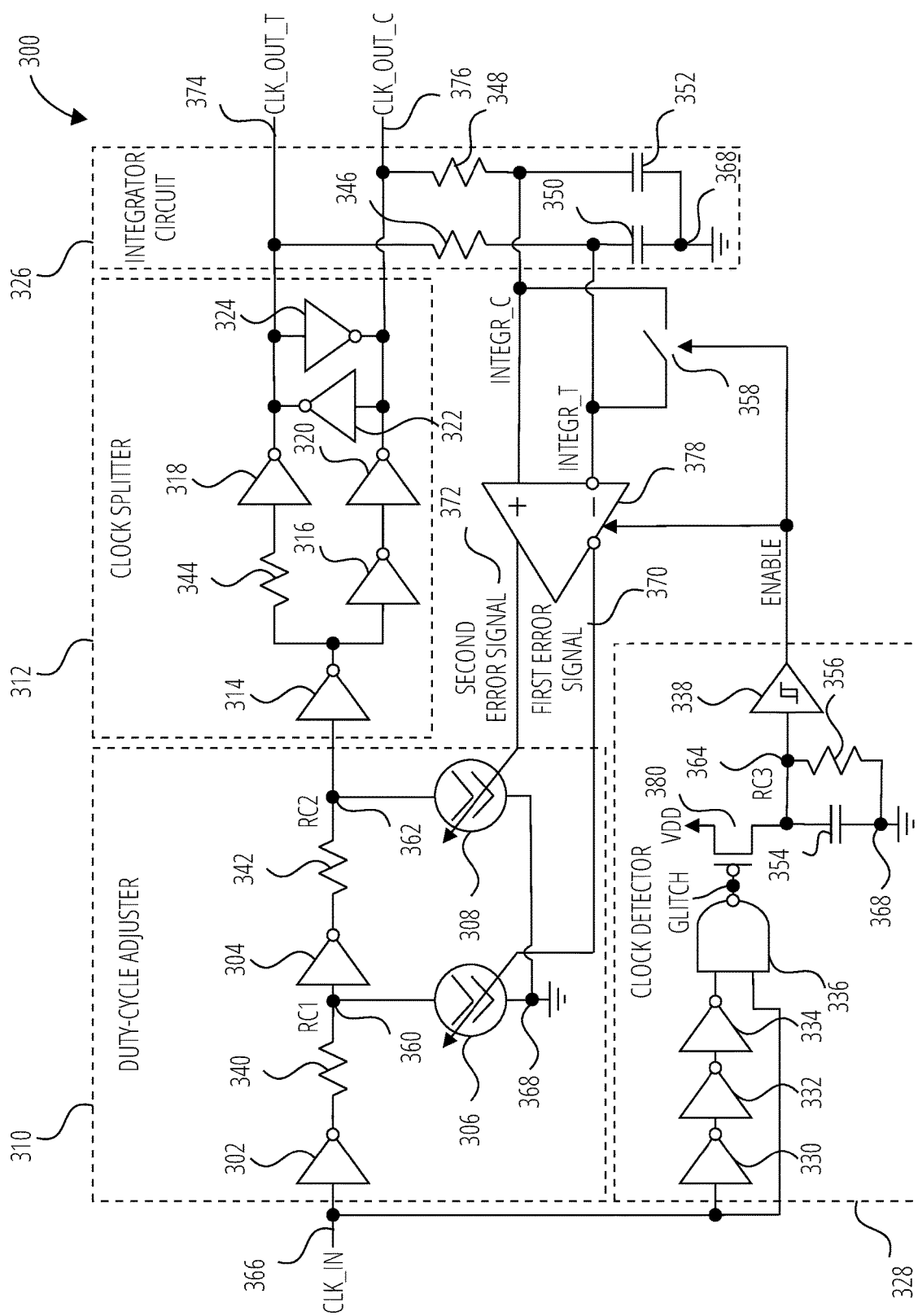
FIG. 3 is an electrical circuit schematic illustration of a duty-cycle corrector, according to some embodiments.

FIG. 3 is an electrical circuit schematic illustration of a duty-cycle corrector 300, according to some embodiments. The duty-cycle corrector 300 may be an example of the duty-cycle corrector 104 of FIG. 1 and the duty-cycle corrector 204 of FIG. 2. The duty-cycle corrector 300 includes a duty-cycle adjuster 310, a clock splitter 312, an integrator circuit 326, a clock detector 328, an amplifier circuit 378, and an electrically controllable switch 358.

The duty-cycle adjuster 310 is configured to receive an input clock signal CLK_IN and correct a corrected duty-cycle of a corrected clock signal CLK_OUT_T relative to an input duty-cycle of the input clock signal CLK_IN. The duty-cycle adjuster 310 includes inverters 302 and 304, resistors 340 and 342, and electrically controllable current sources 306 and 308. Output terminals of the inverters 302 and 304 are electrically connected to resistors 340 and 342, respectively. An input terminal of inverter 302 is electrically connected to an input terminal 366 of the duty-cycle corrector 300. Accordingly, the input terminal of the inverter 302 is configured to receive an input clock signal CLK_IN. The resistor 340 is electrically connected from an output terminal of the inverter 302 to a first node 360 of the duty-cycle corrector 300. A first voltage potential RC1 may be observed at the first node 360. An input terminal of the inverter 304 is electrically connected to the first node 360. The resistor 342 is electrically connected from an output terminal of the inverter 304 to a second node 362. A second voltage potential RC2 may be observed at the second node 362. The electrically controllable current source 306 is electrically connected from the first node 360 to a low voltage potential power node 368 (e.g., a ground node). The electrically controllable current source 308 is electrically connected from the second node 362 to the low voltage potential power node 368.

The electrically controllable current sources 306 and 308 provide bi-directional currents, which may shift a common-mode of the first voltage potential RC1 and the second voltage potential RC2 from halfway between a logic level high voltage potential and a logic level low voltage potential in up and down directions. In case of zero current at the electrically controllable current sources 306 and 308, the input terminal 366 propagates through the duty-cycle adjuster 310 without changing the duty-cycle. If non-zero currents are applied by the electrically controllable current sources 306 and 308, the corrected duty-cycle of the second voltage potential RC2, and by extension of the corrected clock signal CLK_OUT_T, may change proportionally, relative to an input duty-cycle of the input clock signal CLK_IN, to magnitudes and signs (e.g., negative, positive) of the currents. Applying currents at two nodes (i.e., the first node 360 and the second node 362) enables a wider duty-cycle correction range and more linear operation as compared to a case where only one current is applied to one node. A relatively large common mode offset with respect to a threshold voltage potential of the inverters 302 and 304 may cause relatively large cross-currents.

The clock splitter 312 generates, responsive to the second voltage potential RC2 provided by the duty-cycle adjuster 310, two differential clock signals including a corrected clock signal CLK_OUT_T and a complementary clock signal CLK_OUT_C. Accordingly, the second voltage potential RC2 may serve as an intermediate corrected clock signal, and the clock splitter 312 may be configured to receive the intermediate corrected clock signal and generate the corrected clock signal CLK_OUT_T and the complementary corrected clock signal responsive to the intermediate corrected clock signal. The complementary corrected clock signal CLK_OUT_C is complementary to the corrected clock signal CLK_OUT_T.

The clock splitter 312 includes inverters 314, 316, 318, 320, 322, and 324 and a resistor 344. An input terminal of inverter 314 is electrically connected to the second node 362 of the duty-cycle adjuster 310 and is configured to receive the second voltage potential RC2 (the intermediate corrected clock signal) from the duty-cycle adjuster 310. The resistor 344 is electrically connected from an output terminal of inverter 314 to an input terminal of inverter 318. An output terminal of inverter 318 is electrically connected to an integrator output terminal 374 of the integrator circuit 326. An input terminal of inverter 316 is electrically connected to the output terminal of inverter 314. An output terminal of inverter 316 is electrically connected to an input terminal of inverter 320. An output terminal of inverter 320 is electrically connected to a complementary integrator output terminal 376 of the integrator circuit 326. An input terminal of inverter 322 is electrically connected to the complementary integrator output terminal 376. An output terminal of inverter 322 is electrically connected to the integrator output terminal 374. An input terminal of inverter 324 is electrically connected to the integrator output terminal 374. An output terminal of inverter 324 is electrically connected to the complementary integrator output terminal 376.

Resistor 344 may be selected to mimic a delay of inverter 316 so that the corrected clock signal CLK_OUT_T and the complementary corrected clock signal CLK_OUT_C switch at substantially the same time, albeit in opposite directions (i.e., rising edges of the complementary corrected clock signal CLK_OUT_C may occur at substantially the same times as falling edges of the corrected clock signal CLK_OUT_T and vice versa). Inverters 322 and 324 may align the rising and falling edges (e.g., via phase interpolation between the rising and falling edges). The use of differential signaling at the integrator circuit 326 may cause the duty-cycle sensing and correction to be substantially independent from distortions caused by different shapes of rising and falling edges of the corrected clock signal CLK_OUT_T and the complementary corrected clock signal CLK_OUT_C. The clock splitter 312 is configured to provide the corrected clock signal CLK_OUT_T and the complementary corrected clock signal CLK_OUT_C to the integrator circuit 326.

The integrator circuit 326 is configured to receive the corrected clock signal CLK_OUT_T and the complementary corrected clock signal CLK_OUT_C from the clock splitter 312. The integrator circuit 326 is configured to generate integrator signals (e.g., integrator signal INTEGR_T and complementary integrator signal INTEGR_C) responsive to the corrected clock signal CLK_OUT_T and the complementary corrected clock signal CLK_OUT_C. The integrator signals substantially indicate integrals of the corrected clock signal CLK_OUT_T and the complementary corrected clock signal CLK_OUT_C over time. The integrator signal INTEGR_T indicates substantially an integral of the corrected clock signal CLK_OUT_T. The complementary integrator signal INTEGR_C indicates substantially an integral of the complementary corrected clock signal CLK_OUT_C.

The integrator circuit 326 includes a first RC circuit including resistor 346 and capacitor 350. The resistor 346 is electrically connected from the integrator output terminal 374 of the integrator circuit 326 to the capacitor 350. The capacitor 350 is electrically connected from the resistor 346 to the low voltage potential power node 368. The first RC circuit is configured to provide the integrator signal INTEGR_T responsive to the corrected clock signal CLK_OUT_T.

The integrator circuit 326 also includes a second RC circuit including resistor 348 and capacitor 352. The resistor 348 is electrically connected from a complementary integrator output terminal 376 to the capacitor 352. The capacitor 352 is electrically connected from the resistor 348 to the low voltage potential power node 368. The second RC circuit is configured to provide the complementary integrator signal INTEGR_C responsive to the complementary corrected clock signal CLK_OUT_C.

The first RC circuit (including resistor 348 and capacitor 352) and the second RC circuit (including resistor 346 and capacitor 350) may serve as integrators for determining the corrected duty cycle of the corrected clock signal CLK_OUT_T and the complementary corrected clock signal CLK_OUT_C. If the corrected duty-cycle is exactly 50% voltage potentials of the integrator signals INTEGR_T and INTEGR_C may be substantially equal to each other and may be substantially equal to halfway between a logic level high voltage potential and a logic level low voltage potential of the corrected clock signal CLK_OUT_T and the complementary corrected clock signal CLK_OUT_C. If, however, the corrected duty-cycle differs from 50%, voltage potentials of the integrator signals INTEGR_T and INTEGR_C may vary from the halfway voltage potential. By way of non-limiting example, for a corrected duty-cycle of the corrected clock signal CLK_OUT_T of 40%, a voltage potential of the integrator signal INTEGR_T may be substantially at a 40% voltage potential from the logic level low voltage potential to the logic level high voltage potential (e.g., 40% of VDD). Also, a voltage potential of the complementary integrator signal INTEGR_C may be substantially at a 60% voltage potential from the logic level low voltage potential to the logic level high voltage potential (e.g., 60% of VDD). The integrator circuit 326 is configured to provide the integrator signal INTEGR_T and the complementary integrator signal INTEGR_C to the amplifier circuit 378.

The amplifier circuit 378 is configured to control corrections made to the corrected duty-cycle of the corrected clock signal CLK_OUT_T responsive to the integrator signals (integrator signal INTEGR_T and complementary integrator signal INTEGR_C). For example, the amplifier circuit 378 compares the integrator signal INTEGR_T to the complementary integrator signal INTEGR_C and generates a first error signal 370 and a second error signal 372 for controlling the electrically controllable current source 306 and the electrically controllable current source 308, respectively, of the duty-cycle adjuster 310.

In some embodiments the amplifier circuit 378 includes a differential amplifier. The amplifier circuit 378 includes a first amplifier output terminal electrically connected to the electrically controllable current source 306 to deliver the first error signal 370 to the electrically controllable current source 306. The amplifier circuit 378 also includes a second amplifier output terminal electrically connected to the electrically controllable current source 308 to deliver the second error signal 372 to the electrically controllable current source 306. The amplifier circuit 378 further includes a first amplifier input terminal (e.g., an inverting input terminal) configured to receive the integrator signal INTEGR_T. The amplifier circuit 378 also includes a second amplifier input terminal (e.g., a non-inverting input terminal) configured to receive the complementary integrator signal INTEGR_C.

Figure 4:
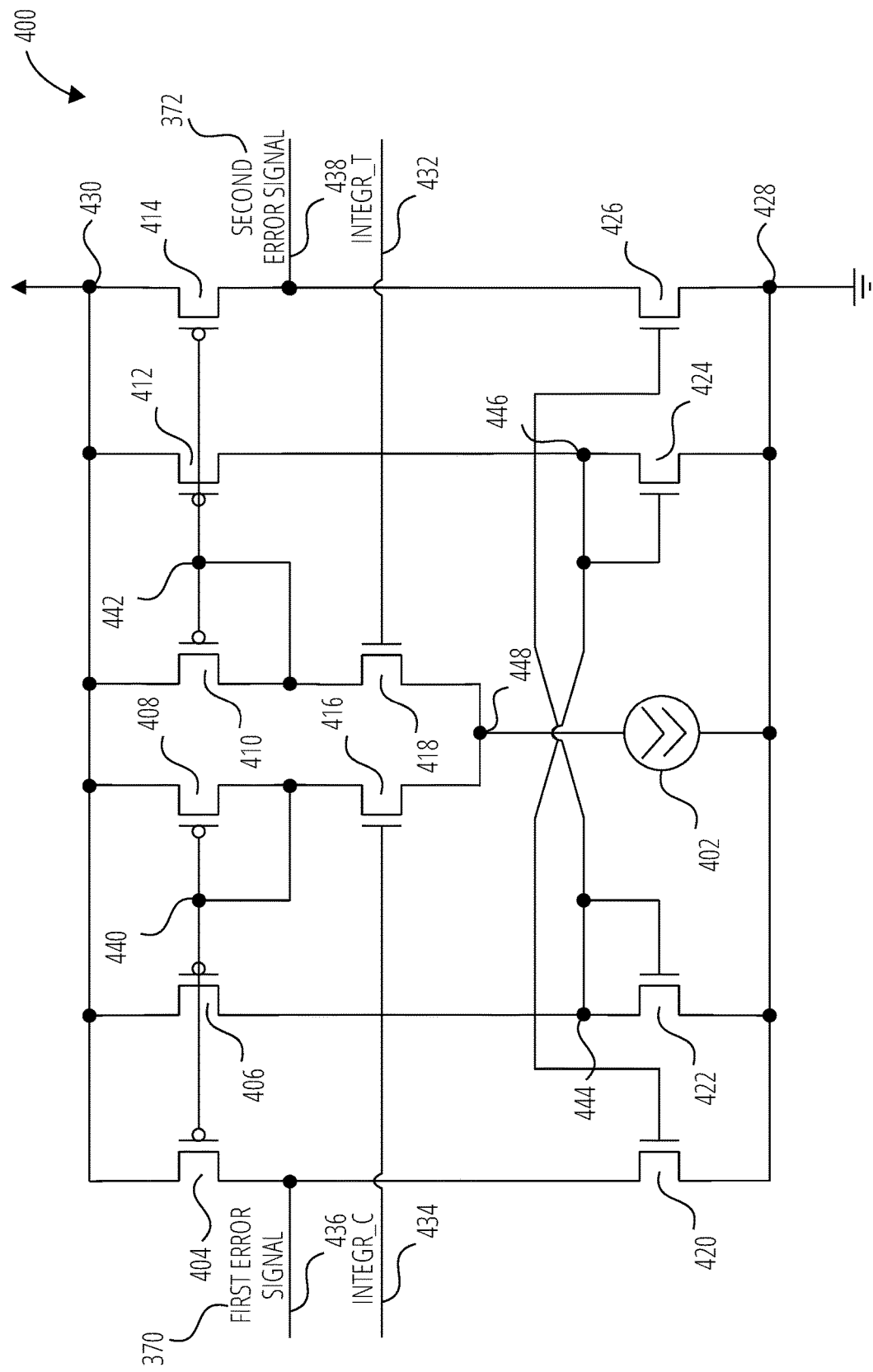
FIG. 4 is an electrical circuit schematic illustration of an amplifier circuit, which may be used as an amplifier circuit of FIG. 3, according to some embodiments.

The duty-cycle adjuster 310 is configured to receive the input clock signal CLK_IN and adjust the corrected duty-cycle of the second voltage potential RC2 (the intermediate corrected clock signal), and by extension the corrected clock signal CLK_OUT_T, responsive to the error signals (the first error signal 370 and the second error signal 372) provided by the amplifier circuit 378. A feedback loop (e.g., a complete negative feedback loop) may maintain a voltage potential difference between the integrator signal INTEGR_T and the complementary integrator signal INTEGR_C substantially equal to zero volts. As a result, the corrected duty-cycle may be maintained at substantially 50%. Compensation circuits may be used for feedback loop stability, but are not shown in FIG. 3 in the interest of simplicity. A detailed example of an amplifier circuit 400, which may be used for the amplifier circuit 378, is shown in FIG. 4.

The clock detector 328 is configured to disable corrections made to the corrected duty-cycle of the corrected clock signal CLK_OUT_T responsive to a detection that the input clock signal CLK_IN is disabled. By way of non-limiting example, the clock detector 328 may be configured to deactivate the amplifier circuit 378 responsive to the detection that the input clock signal CLK_IN is disabled or deactivated. In other words, the amplifier circuit 378 is configured to be disabled responsive to a detection that the input clock signal CLK_IN is disabled or deactivated.

The clock detector 328 is configured to provide an enable signal ENABLE to the amplifier circuit 378. The enable signal ENABLE is configured to control enablement and disablement of the amplifier circuit. The clock detector 328 is configured to assert the enable signal ENABLE during at least a portion of each clock cycle of the input signal responsive to the input clock signal CLK_IN being enabled. The clock detector 328 is also configured to maintain the enable signal ENABLE de-asserted responsive to the input clock signal CLK_IN being disabled.

The clock detector 328 includes a string of inverters 330, 332, and 334 configured to receive the input clock signal CLK_IN (e.g., at an input terminal of inverter 330) and provide an inverted input clock signal. The clock detector 328 also includes a NAND gate 336 configured to provide a glitch signal GLITCH responsive to the input clock signal CLK_IN and the inverted clock signal from the string of inverters 330, 332, and 334. The clock detector 328 further includes an RC circuit including a resistor 356 and a capacitor 354 electrically connected in parallel with each other from a third node 364 to the low voltage potential power node 368. The clock detector 328 also includes a transistor 380 (e.g., a PMOS transistor) electrically connected from a power supply node VDD to the RC circuit (i.e., to the third node 364). The transistor 380 is configured to electrically connect the third node 364 (also, the RC circuit) to the power supply node VDD responsive to an assertion of the glitch signal GLITCH (e.g., a logic level low voltage potential if the transistor 380 is a PMOS transistor). The clock detector 328 further includes a Schmitt trigger inverter 338 electrically connected from the RC circuit (i.e., the third node 364) to the amplifier circuit 378. The Schmitt trigger inverter 338 is configured to provide the enable signal ENABLE to the amplifier circuit 378.

Glitches (e.g., assertions of the glitch signal GLITCH) on a gate terminal of transistor 380 may cause the capacitor 354 to charge. The capacitor 354 may slowly discharge via resistor 356, which defines the lowest frequency that could be detected. A third voltage potential RC3 at the third node 364 is gated by the Schmitt trigger inverter 338 to improve noise immunity and define the lowest frequency for duty-cycle adjustment. As a result, duty-cycle adjustment may not be enabled by every rising edge of the input clock signal CLK_IN, but rather only once per clock enabling.

The electrically controllable switch 358 is configured to electrically connect the first amplifier input terminal (e.g., the inverting input terminal of amplifier circuit 378) to the second amplifier input terminal (e.g., the non-inverting input terminal of amplifier circuit 378) responsive to the detection that the input clock signal CLK_IN is disabled or deactivated. The clock detector 328 is configured to provide the enable signal ENABLE to the electrically controllable switch 358. The enable signal ENABLE is configured to control opening and closing of the electrically controllable switch 358. By way of non-limiting example, the electrically controllable switch 358 may close, electrically connecting the first amplifier input terminal to the second amplifier input terminal responsive to an assertion of the enable signal ENABLE. The Schmitt trigger inverter 338 is electrically connected from the RC circuit (i.e., the third node 364) to the electrically controllable switch 358. The Schmitt trigger inverter 338 is configured to provide the enable signal ENABLE to the electrically controllable switch 358.

The clock detector 328 may enable duty-cycle correction only when input clock signal CLK_IN is activated or enabled. As discussed above, when the input clock signal CLK_IN is not actively oscillating, the input clock signal CLK_IN may be maintained at a logic level low voltage potential (e.g., a "0") are at a logic level high voltage potential (e.g., a "1"). Absent the disablement of the amplifier circuit 378 and the closing of the electrically controllable switch 358 responsive to the input clock signal CLK_IN, the integrator signal INTEGR_T and the complementary integrator signal INTEGR_C would saturate to the logic level voltage potentials (e.g., supply rail voltage potentials). In this state, if the input clock signal started to oscillate, the duty-cycle adjuster 310 would start to operate from a maximum possible duty-cycle distortion, and consequently the first several cycles of the output clock signal CLK_OUT would have extremely low or extremely high corrected duty-cycle or may disappear completely.

Use of the clock detector 328 with the amplifier circuit 378 and the electrically controllable switch 358 keeps the error signals 370 and 372 provided to the current sources in equal and/or zero values by electrically connecting the first amplifier input terminal with the second amplifier input terminal. As a result, both the integrator signal INTEGR_T and the complementary integrator signal INTEGR_C may be maintained substantially at a halfway point between a logic level low voltage potential and a logic level high voltage potential and the amplifier circuit 378 may be disabled. In this case the first few clock cycles of the corrected clock signal CLK_OUT_T be provided by the duty-cycle corrector 300 with no duty-cycle correction (e.g., duty-cycle substantially equal to 1). The duty-cycle corrector 300 may later start the duty-cycle correction and the corrected duty-cycle of the corrected clock signal CLK_OUT_T may settle to substantially 50% several (e.g., 20 to 30) clock cycles later.

FIG. 4 is an electrical circuit schematic illustration of an amplifier circuit 400, which may be used as the amplifier circuit 378 of FIG. 3, according to some embodiments. The amplifier circuit 400 includes a first amplifier input terminal 432, a second amplifier input terminal 434, a first amplifier output terminal 436, a second amplifier output terminal 438, a low voltage potential power node 428 (e.g., GND, VSS), a high voltage potential power node 430 (e.g., VDD), a fourth node 440, a fifth node 442, a sixth node 444, a seventh node 446, and an eighth node 448. The amplifier circuit 400 also includes a current source 402, PMOS transistors 404, 406, 408, 410, 412, and 414, and NMOS transistors 416, 418, 420, 422, 424, and 426.

The NMOS transistor 416 and the NMOS transistor 418 may serve as a differential stage that receives integrator signals INTEGR_T and INTEGR_C. The NMOS transistor 416 is electrically connected from the fourth node 440 to the eighth node 448. A gate terminal of the NMOS transistor 416 is electrically connected to the second amplifier input terminal 434. Accordingly, the gate terminal of the NMOS transistor 416 is configured to receive the complementary integrator signal INTEGR_C. The NMOS transistor 418 is electrically connected from the fifth node 442 to the eighth node 448. A gate terminal of the NMOS transistor 418 is electrically connected to the first amplifier input terminal 432. Accordingly, the gate terminal of the NMOS transistor 418 is configured to receive the integrator signal INTEGR_T.

The PMOS transistor 404 is electrically connected from the high voltage potential power node 430 to the first amplifier output terminal 436. The PMOS transistor 406 is electrically connected from the high voltage potential power node 430 to the sixth node 444. The PMOS transistor 408 is electrically connected from the high voltage potential power node 430 to the fourth node 440. Gate terminals of the PMOS transistors 404, 406, and 408 are electrically connected to the fourth node 440.

The PMOS transistor 414 is electrically connected from the high voltage potential power node 430 to the second amplifier output terminal 438. The PMOS transistor 412 is electrically connected from the high voltage potential power node 430 to the seventh node 446. The PMOS transistor 410 is electrically connected from the high voltage potential power node 430 to the fifth node 442. Gate terminals of the PMOS transistors 410, 412, and 414 are electrically connected to the fifth node 442.

The NMOS transistor 420 is electrically connected from the first amplifier output terminal 436 to the low voltage potential power node 428. A gate terminal of the NMOS transistor 420 is electrically connected to the seventh node 446. The NMOS transistor 422 is electrically connected from the sixth node 444 to the low voltage potential power node 428. A gate terminal of the NMOS transistor 422 is electrically connected to the sixth node 444.

The NMOS transistor 424 is electrically connected from the seventh node 446 to the low voltage potential power node 428. A gate terminal of the NMOS transistor 424 is electrically connected to the seventh node 446. The NMOS transistor 426 is electrically connected from the second amplifier output terminal 438 to the low voltage potential power node 428. A gate terminal of the NMOS transistor 426 is electrically connected to the sixth node 444. The current source 402 is electrically connected from the eighth node 448 to the low voltage potential power node 428.

The PMOS transistor 404 and the PMOS transistor 408 may be cross-connected current mirrors (only one side considered) for the pull-up current and NMOS transistor 420 and NMOS transistor 424 may be cross-connected current mirrors for the pull-down current.

If the input signals, integrator signals INTEGR_T and INTEGR_C, at the first amplifier input terminal 432 and the second amplifier input terminal 434, respectively, are at the same voltage potential, both the pull-up and pull-down currents may have a same magnitude and an opposite direction. As a result, a current provided to the first amplifier output terminal 436 (the first error signal 370) is zero. If the op-amp differential input signal (a difference between the integrator signals INTEGR_T and INTEGR_C) is different from zero, one of the pull-up or pull-down currents will dominate and extra current will be added or subtracted to the first amplifier output terminal 436 and the second amplifier output terminal 438 (at the first error signal 370 and the second error signal 372), respectively, causing duty-cycle correction (e.g., using the duty-cycle corrector 300 of FIG. 3).

Figure 5:
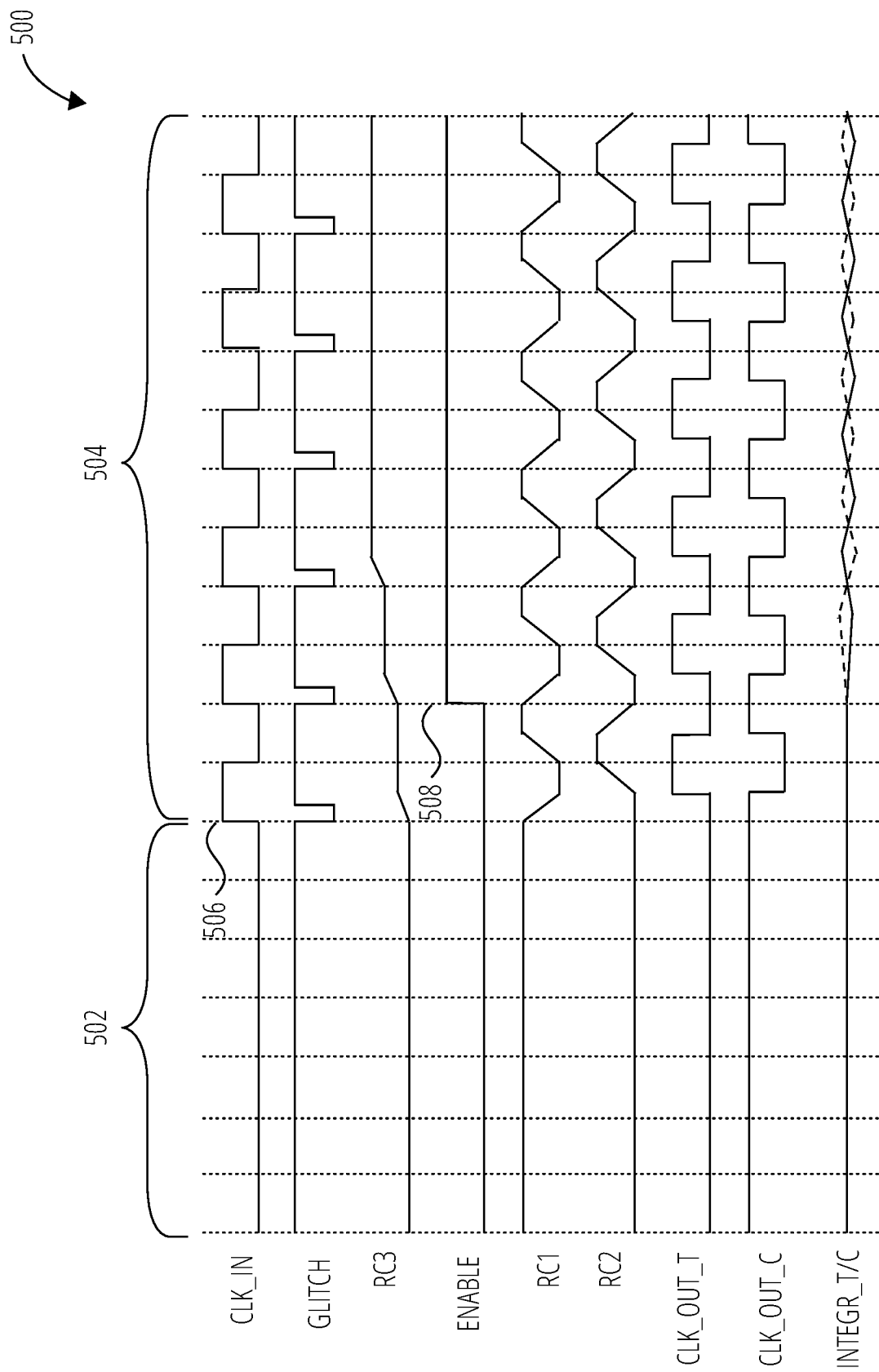
FIG. 5 is a signal timing diagram of examples of signals of the duty-cycle corrector of FIG. 3 with a duty-cycle of the input clock signal at substantially 50%.

FIG. 5 is a signal timing diagram of examples of signals 500 of the duty-cycle corrector 300 of FIG. 3 with a duty-cycle of the input clock signal CLK_IN at substantially 50%. The signals 500 include the input clock signal CLK_IN, the glitch signal GLITCH, the third voltage potential RC3, the enable signal ENABLE, the first voltage potential RC1, the second voltage potential RC2, the corrected clock signal CLK_OUT_T, the complementary corrected clock signal CLK_OUT_C, and the integrator signals INTEGR_T/C. The integrator signal INTEGR_T is shown using a solid line and the complementary integrator signal INTEGR_C is shown using a broken line.

FIG. 5 illustrates the signals 500 during an input clock disabled period of time 502 and an input clock enabled period of time 504. During the input clock disabled period of time 502 the input clock signal CLK_IN is maintained at a logic level low voltage potential, the glitch signal GLITCH is maintained at a logic level high voltage potential, the third voltage potential RC3 is maintained at the logic level low voltage potential, the enable signal ENABLE is maintained at the logic level low voltage potential, the first voltage potential RC1 is maintained at the logic level high voltage potential, the second voltage potential is maintained at the logic level low voltage potential, the corrected clock signal CLK_OUT_T is maintained at the logic level low voltage potential, and the complementary corrected clock signal CLK_OUT_C is maintained at the logic level high voltage potential. As previously discussed, during the input clock disabled period of time 502 the integrator signals INTEGR_T/C are maintained at a point substantially halfway between the logic level high voltage potential and the logic level low voltage potential.

At an input clock enable time 506 the input clock signal CLK_IN is enabled. As a result, during the input clock enabled period of time 504 following the input clock enable time 506 the input clock signal CLK_IN oscillates between the logic level high voltage potential and the logic level low voltage potential. As may be seen by observing the input clock signal CLK_IN during the input clock enabled period of time 504, the input duty-cycle of the input clock signal CLK_IN is substantially 50%.

At positive edges of the input clock signal CLK_IN the glitch signal GLITCH pulses briefly to the logic level low voltage potential because for a brief moment the inputs to the NAND gate 336 (FIG. 3) are the same due to a delay added by the inverters 330, 332, and 334 (FIG. 3). Responsive to each pulse of the glitch signal GLITCH to the logic level low voltage potential, the transistor 380 transitions from an electrically insulating state to an electrically conducting state, which electrically connects the power supply node VDD to the capacitor 354 (FIG. 3). As a result, the capacitor 354 charges, and the third voltage potential RC3 increases at each pulse of the glitch signal GLITCH.

At a duty-cycle correction enable time 508 the third voltage potential RC3 reaches a switching threshold voltage potential of the Schmitt trigger inverter 338. As a result, the enable signal ENABLE may be asserted (switched from the logic level low voltage potential to the logic level high voltage potential) at the duty-cycle correction enable time 508. The enable signal ENABLE may remain asserted for the remainder of the input clock enabled period of time 504 since the third voltage potential RC3 continues to increase with each pulse of the glitch signal GLITCH through the input clock enabled period of time 504 until the third voltage potential RC3 reaches and is held at the logic level high voltage potential.

At the input clock enable time 506 the first voltage potential RC1 and the second voltage potential RC2 begin to oscillate. The second voltage potential RC2 is substantially inverse, or complementary, to the first voltage potential RC1 accept that the second voltage potential is delayed as compared to the first voltage potential (e.g., due to a delay of inverter 304 and resistor 342 of FIG. 3). Since the duty-cycle of the input clock signal CLK_IN is substantially 50%, the duty-cycles of the first voltage potential RC1 and the second voltage potential RC2 are also substantially 50% even before the duty-cycle correction enable time 508.

Responsive to the oscillations of the second voltage potential RC2 during the input clock enabled period of time 504 the clock splitter 312 (FIG. 3) provides the corrected clock signal CLK_OUT_T and the complementary corrected clock signal CLK_OUT_C. Since the duty-cycle of the second voltage potential RC2 is substantially 50%, a corrected duty cycle of the corrected clock signal CLK_OUT_T is also 50%, as is a complementary corrected duty-cycle of the corrected complementary clock signal CLK_OUT_C, even before the duty-cycle correction enable time 508.

After the duty-cycle correction enable time 508 the integrator signals INTEGR_T/C show small oscillations as the RC circuits of the integrator circuit 326 (FIG. 3) charge and discharge responsive to the corrected clock signal CLK_OUT_T and the complementary corrected clock signal CLK_OUT_C. Since the input-cycle of the input clock signal CLK_IN is already at substantially 50%, however, the error signals (second error signal 372 and integrator output terminal 374 of FIG. 3) resulting from the oscillations in the integrator signals INTEGR_T/C may be relatively small, and the duty-cycle adjuster 310 (FIG. 3) does not make significant corrections to the corrected duty-cycle of the corrected clock signal CLK_OUT_T.

Figure 6:
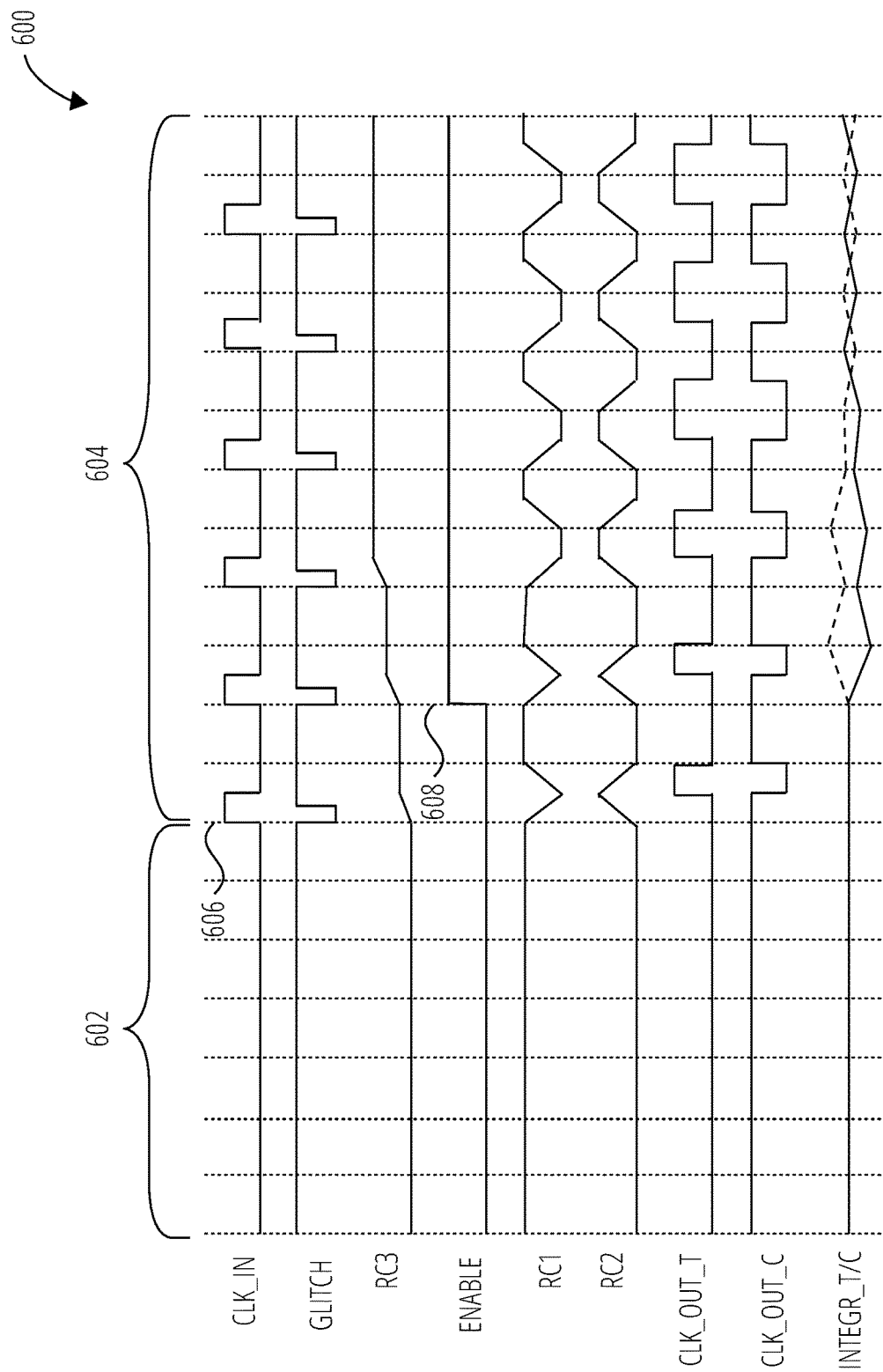
FIG. 6 is a signal timing diagram of examples of signals of the duty-cycle corrector of FIG. 3 with a duty-cycle of the input clock signal at substantially 30%.

FIG. 6 is a signal timing diagram of examples of signals 600 of the duty-cycle corrector 300 of FIG. 3 with a duty-cycle of the input clock signal CLK_IN at substantially 30%. The signals 600 include the input clock signal CLK_IN, the glitch signal GLITCH, the third voltage potential RC3, the enable signal ENABLE, the first voltage potential RC1, the second voltage potential RC2, the corrected clock signal CLK_OUT_T, the complementary corrected clock signal CLK_OUT_C, and the integrator signals INTEGR_T/C. The integrator signal INTEGR_T is shown using a solid line and the complementary integrator signal INTEGR_C is shown using a broken line.

FIG. 6 illustrates the signals 600 during an input clock disabled period of time 602 and an input clock enabled period of time 604. Similarly as discussed above with reference to FIG. 5, during the input clock disabled period of time 602 the input clock signal CLK_IN is maintained at a logic level low voltage potential, the glitch signal GLITCH is maintained at a logic level high voltage potential, the third voltage potential RC3 is maintained at the logic level low voltage potential, the enable signal ENABLE is maintained at the logic level low voltage potential, the first voltage potential RC1 is maintained at the logic level high voltage potential, the second voltage potential RC2 is maintained at the logic level low voltage potential, the corrected clock signal CLK_OUT_T is maintained at the logic level low voltage potential, and the complementary corrected clock signal CLK_OUT_C is maintained at the logic level high voltage potential. As also previously discussed, during the input clock disabled period of time 602 the integrator signals INTEGR_T/C are maintained at a point substantially halfway between the logic level high voltage potential and the logic level low voltage potential.

At an input clock enable time 606 the input clock signal CLK_IN is enabled. As a result, during the input clock enabled period of time 604 following the input clock enable time 606 the input clock signal CLK_IN oscillates between the logic level high voltage potential and the logic level low voltage potential. As may be seen by observing the input clock signal CLK_IN during the input clock enabled period of time 604, the input duty-cycle of the input clock signal CLK_IN is substantially 30%. As a result, the input clock signal CLK_IN is strongly distorted at a 30% duty-cycle.

As discussed above, at positive edges of the input clock signal CLK_IN the glitch signal GLITCH pulses briefly to the logic level low voltage potential. Responsive to each pulse of the glitch signal GLITCH to the logic level low voltage potential, the third voltage potential RC3 increases.

At a duty-cycle correction enable time 608 the third voltage potential RC3 reaches a switching threshold voltage potential of the Schmitt trigger inverter 338. As a result, the enable signal ENABLE may be asserted at the duty-cycle correction enable time 608. The enable signal ENABLE may remain asserted for the remainder of the input clock enabled period of time 604 since the third voltage potential RC3 continues to increase with each pulse of the glitch signal GLITCH through the input clock enabled period of time 604 until the third voltage potential RC3 reaches and is held at the logic level high voltage potential.

At the input clock enable time 606 the first voltage potential RC1 and the second voltage potential RC2 begin to oscillate. The second voltage potential RC2 is substantially inverse, or complementary, to the first voltage potential RC1 accept that the second voltage potential is delayed as compared to the first voltage potential. Since the duty-cycle of the input clock signal CLK_IN is substantially 30%, the duty-cycle of the second voltage potential RC2 is also substantially 30% before the duty-cycle correction enable time 608.

Responsive to the oscillations of the second voltage potential RC2 during the input clock enabled period of time 604 the clock splitter 312 (FIG. 3) provides the corrected clock signal CLK_OUT_T and the complementary corrected clock signal CLK_OUT_C. Since the duty-cycle of the second voltage potential RC2 is substantially 30%, a corrected duty cycle of the corrected clock signal CLK_OUT_T is also substantially 30%. A complimentary corrected duty-cycle of the corrected complementary clock signal CLK_OUT_C may be substantially 70% before the duty-cycle correction enable time 608.

After the duty-cycle correction enable time 608 the integrator signals INTEGR_T/C show stronger oscillations than those illustrated in FIG. 5 since the corrected duty-cycle is not 50%, which causes the RC circuits of the integrator circuit 326 (FIG. 3) to charge and discharge responsive to the corrected clock signal CLK_OUT_T and the complementary corrected clock signal CLK_OUT_C. As a result, the error signals (second error signal 372 and integrator output terminal 374 of FIG. 3) resulting from the oscillations in the integrator signals INTEGR_T/C may be relatively large, and the duty-cycle adjuster 310 (FIG. 3) may make significant corrections to the corrected duty-cycle of the corrected clock signal CLK_OUT_T.

It may be observed that the corrected duty-cycle of the corrected clock signal CLK_OUT_T draws closer to 50% with each clock cycle following the duty-cycle correction enable time 608 until the corrected duty-cycle of the corrected clock signal CLK_OUT_T is substantially 50% after only a few clock cycles. Also, it is noted that the corrected clock signal CLK_OUT_T and the complementary corrected clock signal are provided before the duty-cycle correction enable time 608, though with distorted duty-cycles.

Figure 7:
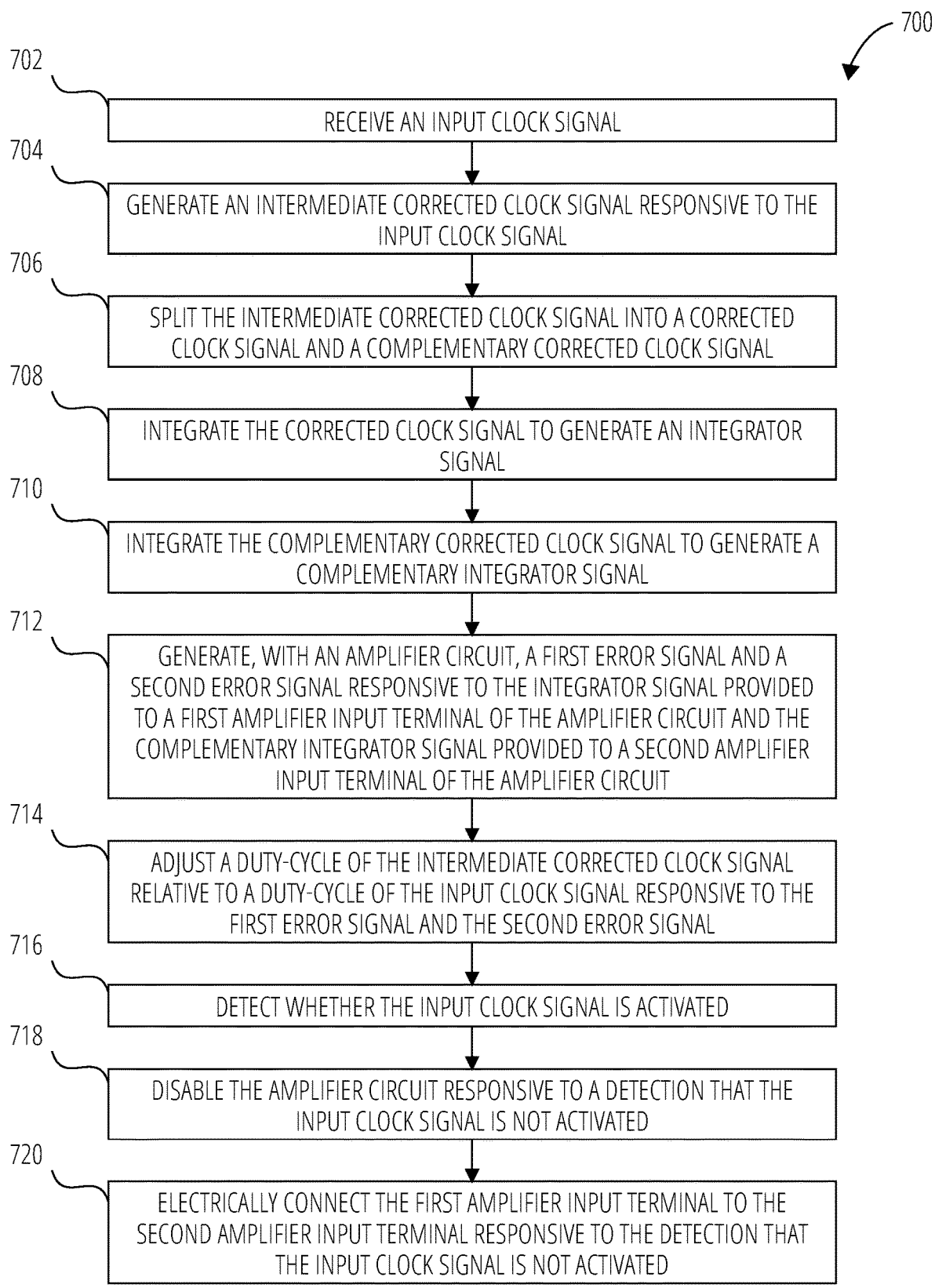
FIG. 7 is a flowchart illustrating a method of correcting a duty-cycle of an input clock signal, according to some embodiments.

FIG. 7 is a flowchart illustrating a method 700 of correcting a duty-cycle of an input clock signal, according to some embodiments. At operation 702 the method 700 includes receiving an input clock signal. At operation 704 the method 700 includes generating an intermediate corrected clock signal responsive to the input clock signal. At operation 706 the method 700 includes splitting the intermediate corrected clock signal into a corrected clock signal and a complementary corrected clock signal.

At operation 708 the method 700 includes integrating the corrected clock signal to generate an integrator signal. In some embodiments integrating the corrected clock signal includes applying the corrected clock signal to a first RC circuit. At operation 710 the method 700 includes integrating the complementary corrected clock signal to generate a complementary integrator signal. In some embodiments integrating the complementary corrected clock signal includes applying the complementary corrected clock signal to a second RC circuit. At operation 712 the method 700 includes generating, with an amplifier circuit, a first error signal and a second error signal responsive to the integrator signal provided to a first amplifier input terminal of the amplifier circuit and the complementary integrator signal provided to a second amplifier input terminal of the amplifier circuit.

At operation 714 the method 700 includes adjusting a duty-cycle of the intermediate corrected clock signal relative to a duty-cycle of the input clock signal responsive to the first error signal and the second error signal. In some embodiments adjusting the duty-cycle of the intermediate corrected clock signal includes providing the first error signal to a first electrically controllable current source electrically connected to a first node of a duty-cycle adjuster. In some embodiments adjusting the duty-cycle of the intermediate corrected clock signal includes providing the second error signal to a second electrically controllable current source electrically connected to a second node of the duty-cycle adjuster.

At operation 716 the method 700 includes detecting whether the input clock signal is activated. At operation 718 the method 700 includes disabling the amplifier circuit responsive to a detection that the input clock signal is not activated. At operation 720 the method 700 includes electrically connecting the first amplifier input terminal to the second amplifier input terminal responsive to the detection that the input clock signal is not activated.

Figure 8:
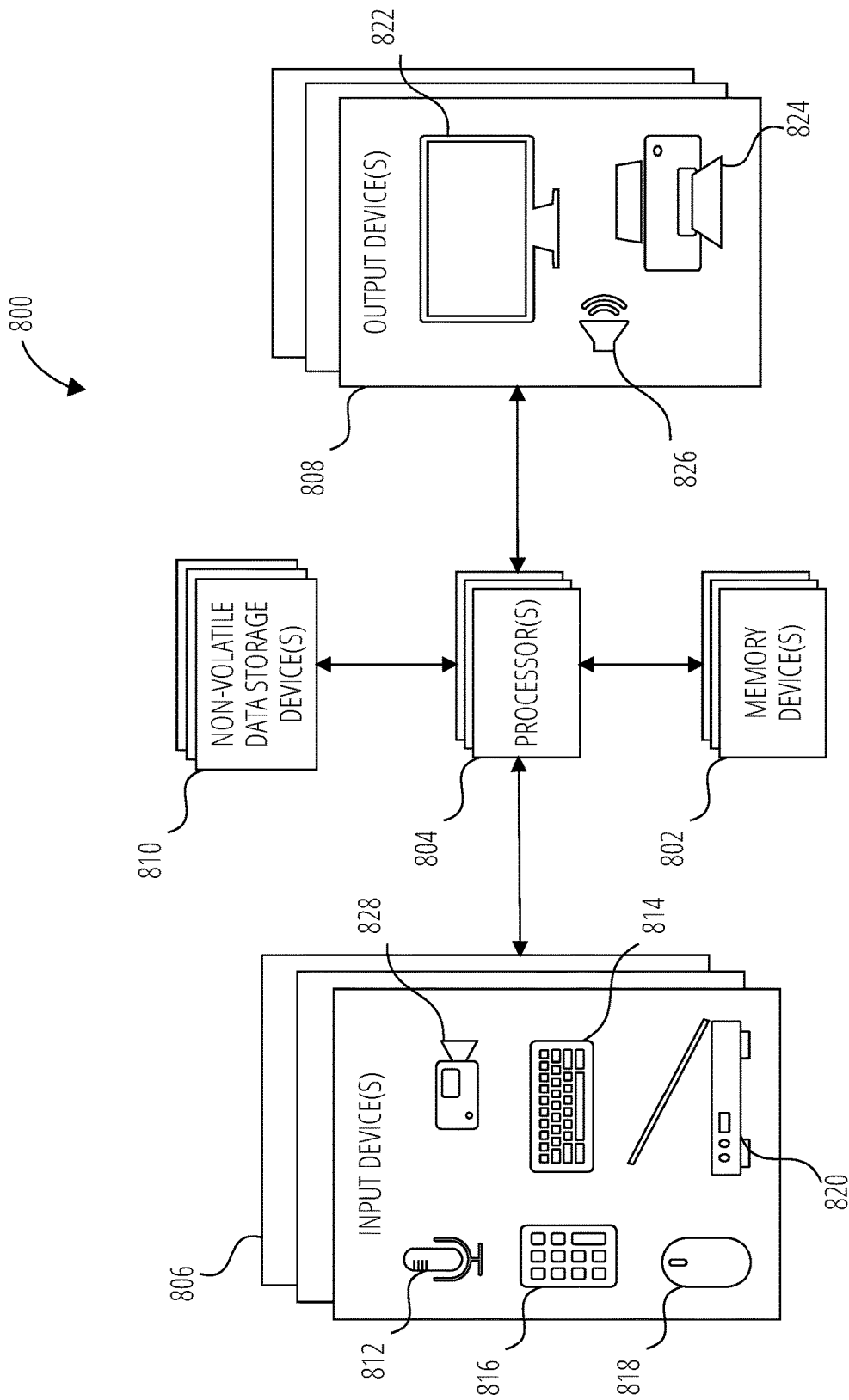
FIG. 8 is a block diagram of a computing system, according to some embodiments.

FIG. 8 is a block diagram of a computing system 800, according to some embodiments. The computing system 800 includes one or more processors 804 operably coupled to one or more memory devices 802, one or more non-volatile data storage devices 810, one or more input devices 806, and one or more output devices 808. In some embodiments the computing system 800 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 804 may include a central processing unit (CPU) or other processor configured to control the computing system 800. In some embodiments the one or more memory devices 802 include random access memory (RAM), such as volatile data storage (e.g., dynamic RAM (DRAM) static RAM (SRAM), etc.). In some embodiments the one or more non-volatile data storage devices 810 include a hard drive, a solid state drive, Flash memory, erasable programmable read only memory (EPROM), other non-volatile data storage devices, or any combination thereof. In some embodiments the one or more input devices 806 include a keyboard 814, a pointing device 818 (e.g., a mouse, a track pad, etc.), a microphone 812, a keypad 816, a scanner 820, a camera 828, other input devices, or any combination thereof. In some embodiments the output devices 808 include an electronic display 822, a speaker 826, a printer 824, other output devices, or any combination thereof.

In some embodiments the one or more memory devices 802 include the memory device 200 of FIG. 2. In such embodiments the memory devices 802 may include a duty-cycle corrector such as the duty-cycle corrector 300 of FIG. 3. Accordingly, the one or more memory devices 802 may operate on a corrected clock signal (e.g., the corrected clock signal CLK_OUT_T of FIG. 1, FIG. 2, FIG. 3, FIG. 5, or FIG. 6) that has a corrected duty-cycle corrected according to one or more embodiments discussed herein.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
an integrator circuit configured to receive a corrected clock signal and a complementary corrected clock signal, the complementary corrected clock signal complementary to the corrected clock signal, the integrator circuit configured to provide:
an integrator signal indicating substantially an integral of the corrected clock signal; and
a complementary integrator signal indicating substantially an integral of the complementary corrected clock signal;
an amplifier circuit configured to control corrections made to a duty-cycle of the corrected clock signal, the amplifier circuit configured to be disabled responsive to a detection that an input clock signal is disabled, the amplifier circuit including:

a first amplifier input terminal configured to receive the integrator signal; and a second amplifier input terminal configured to receive the complementary integrator signal; and an electrically controllable switch configured to selectively electrically connect the first amplifier input terminal to the second amplifier input terminal responsive to the detection that the input clock signal is disabled.

2. The apparatus of claim 1, further comprising a clock detector configured to provide an enable signal to the amplifier circuit and the electrically controllable switch, the enable signal configured to control enablement and disablement of the amplifier circuit, the enable signal further configured to control opening and closing of the electrically controllable switch.

3. The apparatus of claim 2, wherein the clock detector is configured to:

assert the enable signal during at least a portion of each clock cycle of the input clock signal responsive to the input clock signal being enabled; and maintain the enable signal de-asserted responsive to the input clock signal being disabled.

4. The apparatus of claim 3, wherein the clock detector includes:

a string of one or more inverters configured to receive the input clock signal and provide an inverted input clock signal;

a NAND gate configured to provide a glitch signal responsive to the input clock signal and the inverted input clock signal;

a resistor-capacitor (RC) circuit;

a transistor electrically connected from a power supply node to the RC circuit, the transistor configured to electrically connect the RC circuit to the power supply node responsive to an assertion of the glitch signal; and an inverter electrically connected from the RC circuit to the amplifier circuit and the electrically controllable switch, the inverter configured to provide the enable signal to the amplifier circuit and the electrically controllable switch.

5. The apparatus of claim 1, further comprising a duty-cycle adjuster configured to receive the input clock signal and adjust the duty-cycle of an intermediate corrected clock signal responsive to error signals provided by the amplifier circuit.

6. The apparatus of claim 5, further comprising a clock splitter configured to receive the intermediate corrected clock signal and generate the corrected clock signal and the complementary corrected clock signal responsive to the intermediate corrected clock signal.

7. The apparatus of claim 1, wherein the amplifier circuit includes a differential operational amplifier.

8. The apparatus of claim 1, wherein the integrator circuit includes a first resistor-capacitor (RC) circuit and a second RC circuit, the first RC circuit configured to provide the integrator signal responsive to the corrected clock signal, the second RC circuit configured to provide the complementary integrator signal responsive to the complementary corrected clock signal.

9. An apparatus, comprising:

a duty-cycle adjuster configured to receive an input clock signal and correct a duty-cycle of a corrected clock signal relative to an input duty-cycle of the input clock signal;

an integrator circuit configured to generate an integrator signal responsive to the corrected clock signal, the integrator signal substantially indicating an integral of the corrected clock signal over time;

an amplifier circuit configured to control corrections made to the duty-cycle of the corrected clock signal by the duty-cycle adjuster responsive to the integrator signal; and a clock detector configured to disable the corrections made to the duty-cycle of the corrected clock signal responsive to a detection that the input clock signal is disabled.

10. The apparatus of claim 9, wherein the clock detector is configured to deactivate the amplifier circuit responsive to the detection that the input clock signal is disabled.

11. The apparatus of claim 9, wherein the duty-cycle adjuster includes:

a first inverter, a first input terminal of the first inverter configured to receive in input clock signal;

a first resister electrically connected from a first output terminal of the first inverter to a first node;

a second inverter, a second input terminal of the second inverter electrically connected to the first node;

a second resistor electrically connected from a second output terminal of the second inverter to a second node;

a first electrically controllable current source electrically connected from the first node to a power supply node; and a second electrically controllable current source electrically connected from the second node to the power supply node.

12. The apparatus of claim 11, wherein the amplifier circuit includes a differential amplifier comprising a first amplifier output terminal and a second amplifier output terminal, the first amplifier output terminal electrically connected to the first electrically controllable current source, the second amplifier output terminal electrically connected to the second electrically controllable current source.

13. The apparatus of claim 12, further comprising an electrically controllable switch configured to electrically connect a first amplifier input terminal of the differential amplifier to a second amplifier input terminal of the differential amplifier responsive to the detection that the input clock signal is disabled.

14. The apparatus of claim 9, further comprising a clock splitter configured to receive an intermediate corrected clock signal from the duty-cycle adjuster, the clock splitter configured to provide the corrected clock signal and a complementary corrected clock signal to the integrator circuit, the complementary corrected clock signal complementary to the corrected clock signal.

15. A method of correcting a duty-cycle of an input clock signal, the method comprising:

generating an intermediate corrected clock signal responsive to the input clock signal;

splitting the intermediate corrected clock signal into a corrected clock signal and a complementary corrected clock signal;

integrating the corrected clock signal to generate an integrator signal;

integrating the complementary corrected clock signal to generate a complementary integrator signal;

generating, with an amplifier circuit, a first error signal and a second error signal responsive to the integrator signal provided to a first amplifier input terminal of the amplifier circuit and the complementary integrator signal provided to a second amplifier input terminal of the amplifier circuit;

adjusting a corrected duty-cycle of the intermediate corrected clock signal relative to an input duty-cycle of the input clock signal responsive to the first error signal and the second error signal; and electrically connecting the first amplifier input terminal to the second amplifier input terminal responsive to a detection that the input clock signal is not activated.

16. The method of claim 15, further comprising disabling the amplifier circuit responsive to the detection that the input clock signal is not activated.

17. The method of claim 15, wherein adjusting the corrected duty-cycle of the intermediate corrected clock signal includes:

providing the first error signal to a first electrically controllable current source electrically connected to a first node of a duty-cycle adjuster; and providing the second error signal to a second electrically controllable current source electrically connected to a second node of the duty-cycle adjuster.

18. The method of claim 15, wherein:

integrating the corrected clock signal comprises applying the corrected clock signal to a first resistor-capacitor (RC) circuit; and integrating the complementary corrected clock signal comprises applying the complementary corrected clock signal to a second RC circuit.

19. The method of claim 15, further comprising providing the corrected clock signal and the complementary corrected clock signal to clock utilizing circuitry.

20. The method of claim 19, wherein providing the corrected clock signal and the complementary corrected clock signal to the clock utilizing circuitry comprises providing the corrected clock signal and the complementary corrected clock signal to memory circuitry.

\* \* \* \* \*